United States Patent
Sasaki (10) Patent No.: US 12,301,179 B2
(45) Date of Patent: May 13, 2025

(54) HIGH FREQUENCY AMPLIFIER

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 608 days.

(21) Appl. No.: 17/639,556

(22) PCT Filed: Dec. 10, 2019

(86) PCT No.: PCT/JP2019/048325
§ 371 (c)(1),
(2) Date: Mar. 1, 2022

(87) PCT Pub. No.: WO2021/117142
PCT Pub. Date: Jun. 17, 2021

(65) Prior Publication Data
US 2022/0337204 A1    Oct. 20, 2022

(51) Int. Cl.
*H03F 3/191* (2006.01)
*H01L 23/66* (2006.01)
(Continued)

(52) U.S. Cl.
CPC .............. *H03F 3/193* (2013.01); *H01L 23/66* (2013.01); *H03F 1/565* (2013.01); *H03F 3/601* (2013.01);
(Continued)

(58) Field of Classification Search
CPC ........................................................ H03F 3/191
(Continued)

(56) References Cited

U.S. PATENT DOCUMENTS

| | | | |
|---|---|---|---|
| 5,352,990 A | 10/1994 | Goto | |
| 6,753,728 B2 * | 6/2004 | Okubo | ................. H03F 1/3229 330/149 |

(Continued)

FOREIGN PATENT DOCUMENTS

| | | |
|---|---|---|
| CN | 2872699 Y | 2/2007 |
| JP | H06-204764 A | 7/1994 |

(Continued)

OTHER PUBLICATIONS

International Search Report issued in PCT/JP2019/048325; mailed Feb. 18, 2020.
(Continued)

*Primary Examiner* — Henry Choe
(74) *Attorney, Agent, or Firm* — Studebaker Brackett PLLC (57) ABSTRACT

An amplifier (T1) amplifies an input signal. A harmonic matching circuit (3) is connected to an output end of the amplifier (T1) via a first wire (W1). The harmonic matching circuit (3) includes a first inductor (L1) connected to the first wire (W1), a first capacitor (C1) connected in series to the first inductor (L1), a second inductor (L2) connected in parallel with the first inductor (L1), and a second capacitor (C2) connected in series to the second inductor (L2). The first inductor (L1) and the second inductor (L2) form a subtractive-polarity coupler which presents mutual inductance having subtractive polarity.

12 Claims, 11 Drawing Sheets

(51) Int. Cl.
   *H03F 1/56* (2006.01)
   *H03F 3/193* (2006.01)
   *H03F 3/60* (2006.01)

(52) U.S. Cl.
   CPC .................. *H01L 2223/6611* (2013.01); *H01L 2223/6655* (2013.01)

(58) Field of Classification Search
   USPC ................................................ 330/302, 305
   See application file for complete search history.

(56) References Cited

U.S. PATENT DOCUMENTS

| | | | | |
|---|---|---|---|---|
| 7,084,708 | B2* | 8/2006 | Sugiura | H01L 24/49 257/E23.079 |
| 8,947,166 | B2* | 2/2015 | Uno | H03F 1/565 330/302 |
| 2002/0105384 | A1 | 8/2002 | Dent | |
| 2004/0041634 | A1* | 3/2004 | Sugiura | H03F 1/565 330/302 |
| 2013/0176079 | A1 | 7/2013 | Uno et al. | |
| 2018/0175811 | A1 | 6/2018 | Canning et al. | |
| 2019/0296693 | A1* | 9/2019 | Ahmed | H03F 3/195 |
| 2021/0044261 | A1 | 2/2021 | Sasaki | |

FOREIGN PATENT DOCUMENTS

| | | |
|---|---|---|
| JP | 5958834 B2 | 8/2016 |
| WO | 2019/202631 A1 | 10/2019 |

OTHER PUBLICATIONS

Office Action issued in TW 109131095; issued by the Taiwan Intellectual Property Office on Oct. 28, 2020.
An Office Action mailed by the Korean Intellectual Property Office on May 20, 2024, which corresponds to Korean Patent Application No. 10-2022-7017783 and is related to U.S. Appl. No. 17/639,556.
An Office Action; mailed by the China National Intellectual Property Administration of the People's Republic of China on Jan. 21, 2025, which corresponds to Chinese Patent Application No. 201980101189.4 and is related to U.S. Appl. No. 17/639,556.

* cited by examiner

HIGH FREQUENCY AMPLIFIER

FIELD

The present disclosure relates to a high frequency amplifier.

BACKGROUND

Lower power consumption during operation, that is, higher efficiency is a fundamental issue in a semiconductor amplifier. One of approaches to this issue in terms of a circuit at a high frequency amplifier which amplifies power at a high frequency exceeding a microwave includes so-called harmonic processing. Here, a frequency of a signal to be amplified by a semiconductor is a fundamental harmonic and a frequency of a multiple of the fundamental harmonic is a harmonic. Harmonic processing is a method for achieving high-efficiency operation by controlling impedance of a peripheral circuit seen from a semiconductor amplifier in a harmonic.

Examples of a circuit which achieves high efficiency of a high frequency amplifier includes a class F amplifier. At the class F amplifier, on a class F load condition that load for even harmonics viewed from a drain terminal of an FET is short-circuited, and load for odd harmonics is open-circuited, a time waveform of a drain voltage is made closer to a rectangular wave to decrease an area of a portion where the time waveform of the drain voltage overlaps a time waveform of a current. This reduces power to be consumed at the FET, so that extremely high drain efficiency can be achieved.

However, actually, parasitic capacity and inductance due to an assembly such as an FET and a wire exist, and these affect time waveforms of a voltage and a current at the drain terminal. It is therefore necessary to design a class F load circuit to be short-circuited for even harmonics and open-circuited for odd harmonics with consideration of these parasitic components (see, for example, PTL 1).

CITATION LIST

Patent Literature

[PTL 1] JP 5958834

SUMMARY

Technical Problem

However, a high frequency amplifier in related art has a problem that it is difficult to achieve impedance matching at a fundamental harmonic, a second harmonic and a third harmonic at the same time.

The present invention has been made to solve the problem as described above and is directed to providing a high frequency amplifier which is capable of achieving impedance matching at a fundamental harmonic, a second harmonic and a third harmonic at the same time.

Solution to Problem

A high frequency amplifier according to the present disclosure includes: an amplifier amplifying an input signal; and a harmonic matching circuit connected to an output end of the amplifier via a first wire, wherein the harmonic matching circuit includes a first inductor connected to the first wire, a first capacitor connected in series to the first inductor, a second inductor connected in parallel with the first inductor, and a second capacitor connected in series to the second inductor, and the first inductor and the second inductor form a subtractive-polarity coupler which presents mutual inductance having subtractive polarity.

Advantageous Effects of Invention

In the present disclosure, mutual inductance having subtractive polarity is generated by the first inductor and the second inductor, so that it is possible to reduce influence of the parasitic inductance of the first wire. Particularly, it is possible to achieve low inductance which is necessary in third harmonic matching. Further, influence by the harmonic matching circuit is reduced by a circuit formed with the first inductor and the first capacitor, and thus, matching of the fundamental harmonic is not affected. It is therefore possible to optimize impedance at the fundamental harmonic, the second harmonic and the third harmonic at the same time.

DESCRIPTION OF EMBODIMENTS

A high frequency amplifier according to the embodiments of the present disclosure will be described with reference to the drawings. The same components will be denoted by the same symbols, and the repeated description thereof may be omitted.

Embodiment 1

Figure 1:
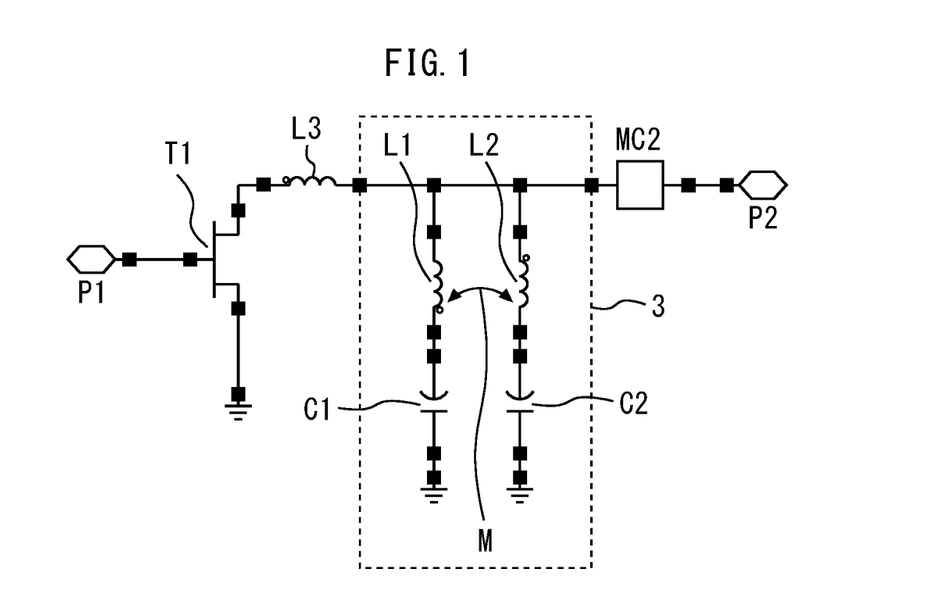
FIG. 1 is a circuit diagram illustrating a high frequency amplifier according to Embodiment 1.
Figure 2:
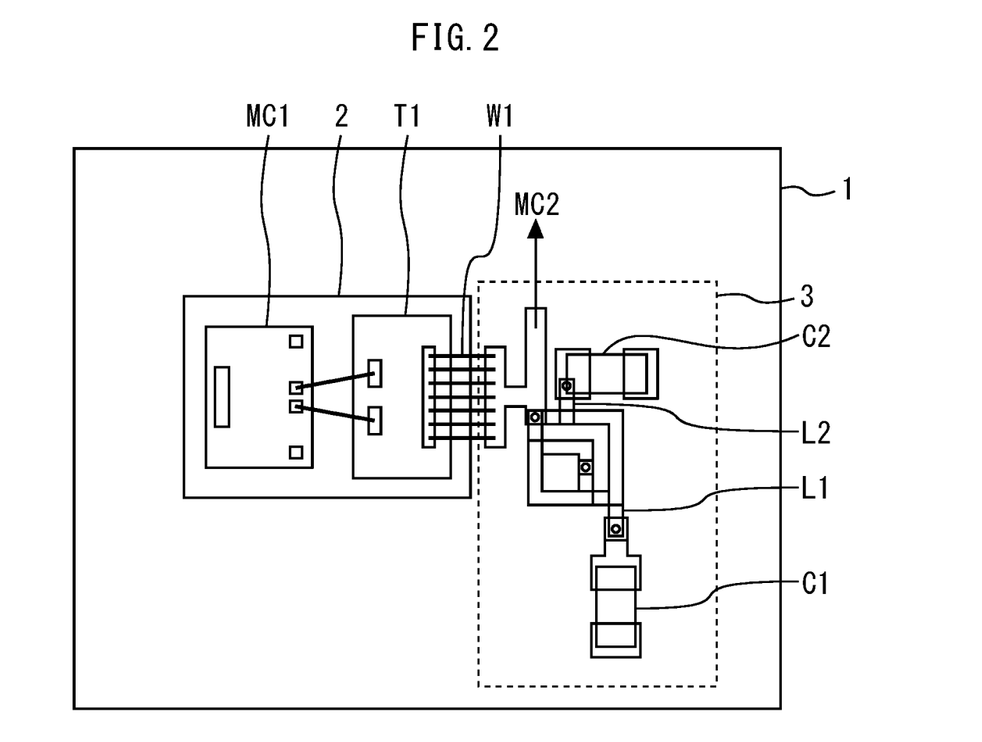
FIG. 2 is a top view illustrating the high frequency amplifier according to Embodiment 1.

FIG. 1 is a circuit diagram illustrating a high frequency amplifier according to Embodiment 1. FIG. 2 is a top view illustrating the high frequency amplifier according to Embodiment 1. A circuit module of the high frequency amplifier is constituted using a multi-layer glass epoxy substrate 1.

A transistor T1 and an input matching circuit MC1 are fixed on a metal 2 in an uppermost layer of the glass epoxy substrate 1 with an electrically conductive adhesive, or the like. The input matching circuit MC1 is connected to a gate of the transistor T1. The transistor T1 is an amplifier which amplifies an input signal input from an input terminal P1 via the input matching circuit MC1, and is, for example, a GaN-based HEMT chip. The metal 2 in the uppermost layer is connected to a ground layer on a rear surface of the glass epoxy substrate 1 through a through-hole. A harmonic matching circuit 3 is connected to a drain pad which is an output end of the transistor T1 via a wire W1. The wire W1 has parasitic inductance L3.

The harmonic matching circuit 3 includes a first inductor L1 connected to the wire W1, a first capacitor C1 connected in series to the first inductor L1, a second inductor L2 connected in parallel with the first inductor L1, and a second capacitor C2 connected in series to the second inductor L2. The first capacitor C1 and the second capacitor C2 are chip capacitors.

One end of a fundamental harmonic matching circuit MC2 for matching impedance for a fundamental harmonic of the input signal is connected to a connection point of the wire W1 and the harmonic matching circuit 3. The other end of the fundamental harmonic matching circuit MC2 is connected to an output terminal P2 of the harmonic amplifier.

Figure 3:
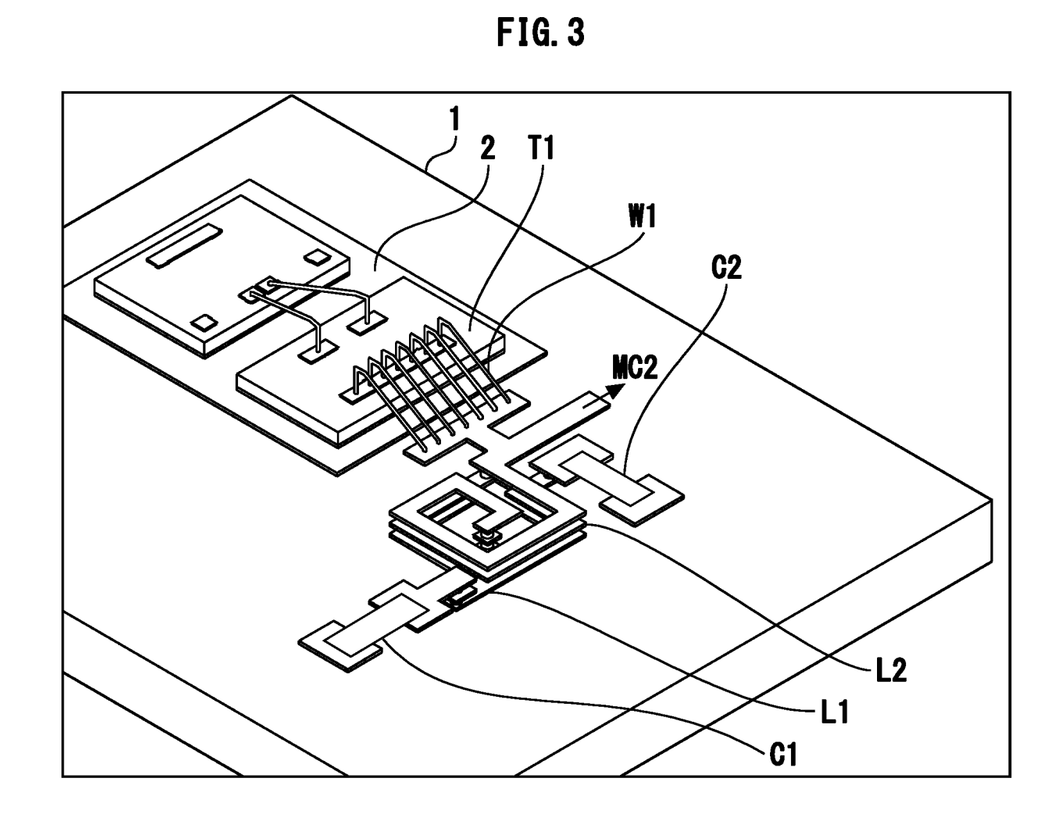
FIG. 3 is a perspective view illustrating the high frequency amplifier according to Embodiment 1.
Figure 4:
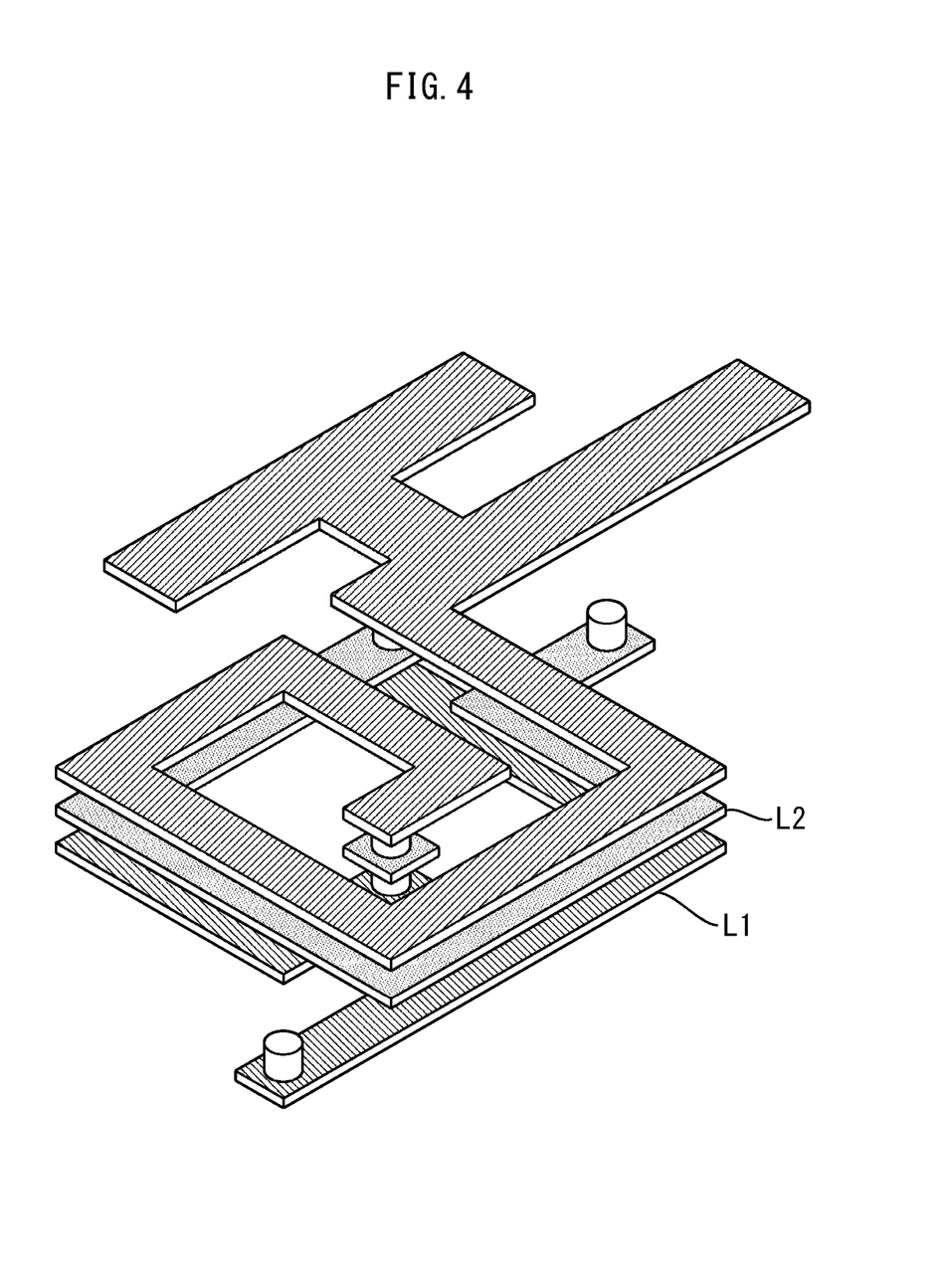
FIG. 4 is a perspective view illustrating the first inductor and the second inductor.

FIG. 3 is a perspective view illustrating the high frequency amplifier according to Embodiment 1. FIG. 4 is a perspective view illustrating the first inductor and the second inductor. The first inductor L1 is formed with wiring layers which are first and third from a surface of the glass epoxy substrate 1. The second inductor L2 is formed with a wiring layer which is second from the surface of the glass epoxy substrate 1. The first inductor L1 is wound clockwise from a drain of the transistor T1 to the first capacitor C1 in planar view viewed from above the glass epoxy substrate 1. The second inductor L2 is wound counterclockwise from the drain of the transistor T1 to the second capacitor C2 in planar view. The first inductor L1 and the second inductor L2 are wound in directions opposite to each other and overlap with each other, so that a subtractive-polarity coupler which presents mutual inductance having subtractive polarity is formed.

In a case where mutual inductance is not taken into account, a resonant frequency of a second harmonic resonant circuit constituted with the second inductor L2 and the second capacitor C2 is set higher than 2fo with respect to a frequency fo of the fundamental harmonic due to influence of the parasitic inductance L3 of the wire W1. Thus, impedance of the second harmonic resonant circuit exhibits capacitance for a frequency equal to or lower than the second harmonic and exhibits inductivity for the third harmonic. For reducing capacity of the second harmonic resonant circuit with respect to the fundamental harmonic, impedance of a resonant circuit constituted with the first inductor L1 and the first capacitor C1 is set so as to exhibit inductivity for the fundamental harmonic.

Figure 5:
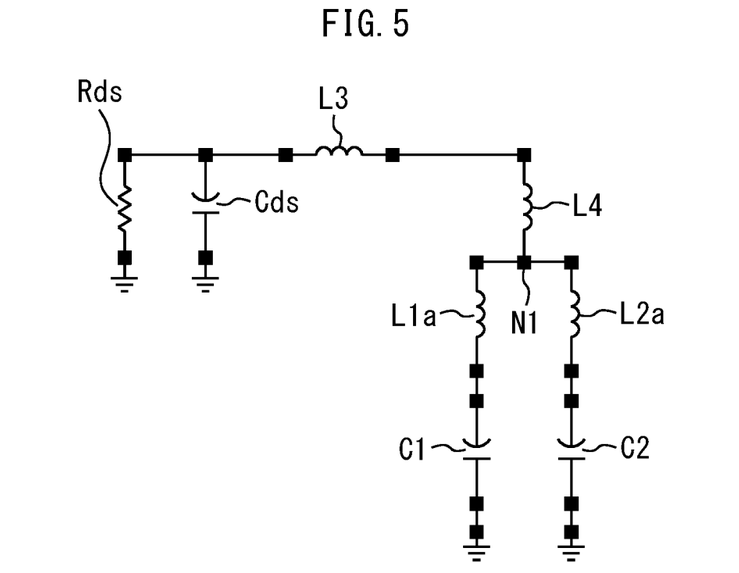
FIG. 5 is an equivalent circuit diagrams for explaining circuit operation of the high frequency amplifier according to Embodiment 1.
Figure 6:
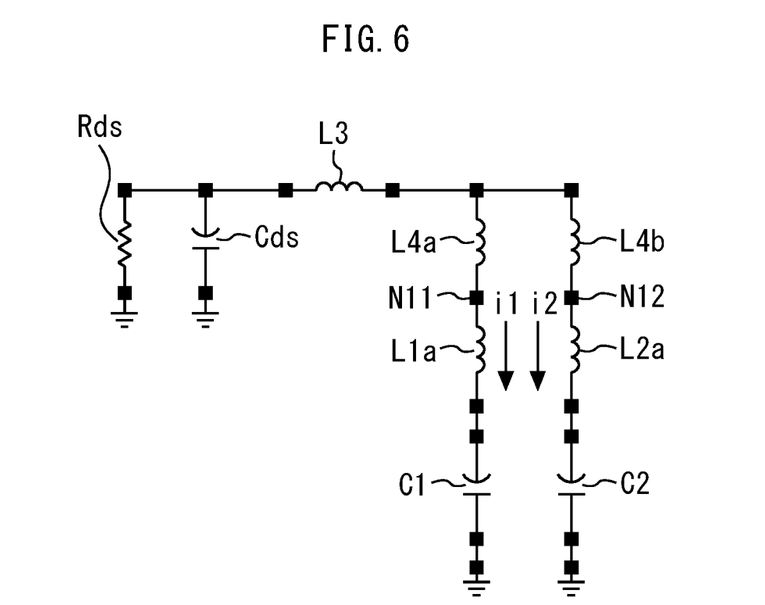
FIG. 6 is an equivalent circuit diagrams for explaining circuit operation of the high frequency amplifier according to Embodiment 1.

Circuit operation in a case where mutual inductance is taken into account will be described next. FIG. 5 and FIG. 6 are equivalent circuit diagrams for explaining circuit operation of the high frequency amplifier according to Embodiment 1. To simplify explanation, it is assumed that the fundamental harmonic matching circuit MC2 is open-circuit. It is assumed that internal load of the transistor T1 is Rds, and parasitic capacity of the transistor T1 is Cds. It is assumed that a current flowing through the first inductor L1 is i1, and a current flowing through the second inductor L2 is i2. It is assumed that inductance of the first inductor L1 is L(L1), inductance of the second inductor L2 is L(L2), and the mutual inductance is -M.

It is desirable that impedance for the harmonic matching circuit 3 viewed from an output end of the transistor T1 is open-circuited for the fundamental harmonic, short-circuited for the second harmonic, and resonates with the parasitic capacity Cds of the transistor T1 and is open-circuited for the third harmonic, so that the high frequency amplifier can perform ideal class F operation.

In FIG. 5, the first inductor L1 and the second inductor L2 in FIG. 1 are replaced with inductors with no coupling. The inductor L4 corresponds to a mutual inductor having subtractive polarity generated by the first inductor L1 and the second inductor L2. Inductance of the fundamental harmonic inductor L1a becomes L(L1)+M, inductance of the harmonic inductor L2a becomes L(L2)+M, and inductance of the inductor L4 becomes -M. A circuit formed with L1a, L2a, C1 and C2 are made open-circuited for the fundamental harmonic by adjusting each constant. This can prevent the circuit from affecting output impedance seen from the output end of the transistor T1 for the fundamental harmonic.

Both the current i1 and the current i2 flow through the inductor L4 in FIG. 5. In FIG. 6, the inductor L4 in FIG. 5 is virtually divided into an inductor L4a through which only the current i1 flows and an inductor L4b through which only the current i2 flows.

It is assumed that inductance of the inductor L4a is L(M1a), and inductance of the inductor L4b is L(M1b). A node N1 in FIG. 5 and nodes N11 and N12 in FIG. 6 have the same potential, and thus, L(M1a) and L(M1b) can be expressed as follows.

$$L(M1a)=-(i1+i2)/i1 \times M$$

$$L(M1b)=-(i1+i2)/i2 \times M$$

It is assumed here that n=i1/i2. n indicates a ratio of currents flowing through the first inductor L1 and the second inductor L2. The above-described L(M1a) and L(M1b) can be expressed as follows using n.

$$L(M1a)=-(1+1/n) \times M$$

$$L(M1b)=-(1+n) \times M$$

It is assumed that series connection of the inductor L1a and the inductor L4a is an inductor L1b. Inductance L(L1b) of the inductor L1b which is fundamental harmonic inductance can be expressed as follows.

$$L(L1b)=L(L1a)+L(M1a)=L(L1)-(1/n) \times M$$

It is assumed that series connection of the inductor L2a and the inductor L4b is an inductor L2b. Inductance L(L2b)

of the inductor L2b which is second harmonic inductance can be expressed as follows.

$$L(L2b)=L(L2a)+L(M1b)=L(L2)-n \times M$$

Figure 7:
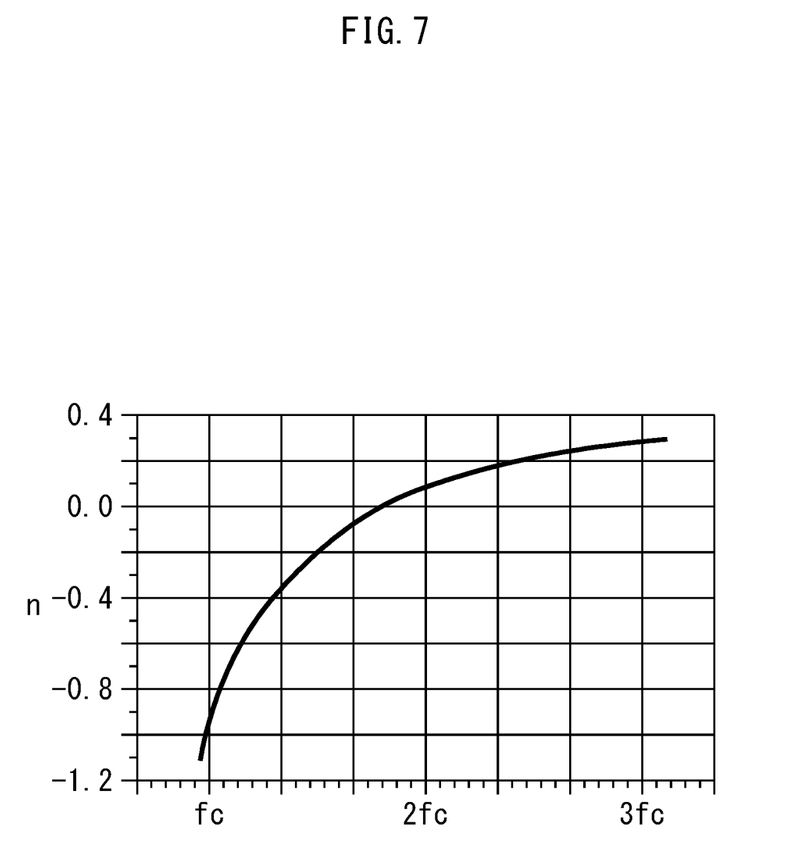
FIG. 7 is a view illustrating frequency dependency of a ratio n of currents flowing through the first inductor and the second inductor.

FIG. 7 is a view illustrating frequency dependency of a ratio n of currents flowing through the first inductor and the second inductor. Only an LC circuit is connected to a path through which the current i1 and the current i2 flow, and thus, a value of n becomes a real number. While L4b, L2a and C2 mainly affect impedance of the harmonic, the value of n increases with a frequency, and thus, it can be understood that equivalent inductance L(L2b) can be reduced with a frequency.

In harmonic matching, particularly, in third harmonic matching, it is necessary to make a value of inductance which resonates with the parasitic capacity Cds of the transistor T1 smaller at a high frequency which is three times as high as the fundamental harmonic. However, it is difficult to make the value of inductance smaller in a circuit in related art with no coupling. In contrast, in the present embodiment, mutual inductance having subtractive polarity is generated by the first inductor L1 and the second inductor L2, so that it is possible to reduce influence of the parasitic inductance L3 of the wire W1. Particularly, it is possible to achieve low inductance which is necessary in third harmonic matching. Further, influence by the harmonic matching circuit 3 is reduced by a circuit formed with the first inductor L1 and the first capacitor C1, and thus, matching of the fundamental harmonic is not affected. It is therefore possible to optimize impedance at the fundamental harmonic, the second harmonic and the third harmonic at the same time.

Figure 8:
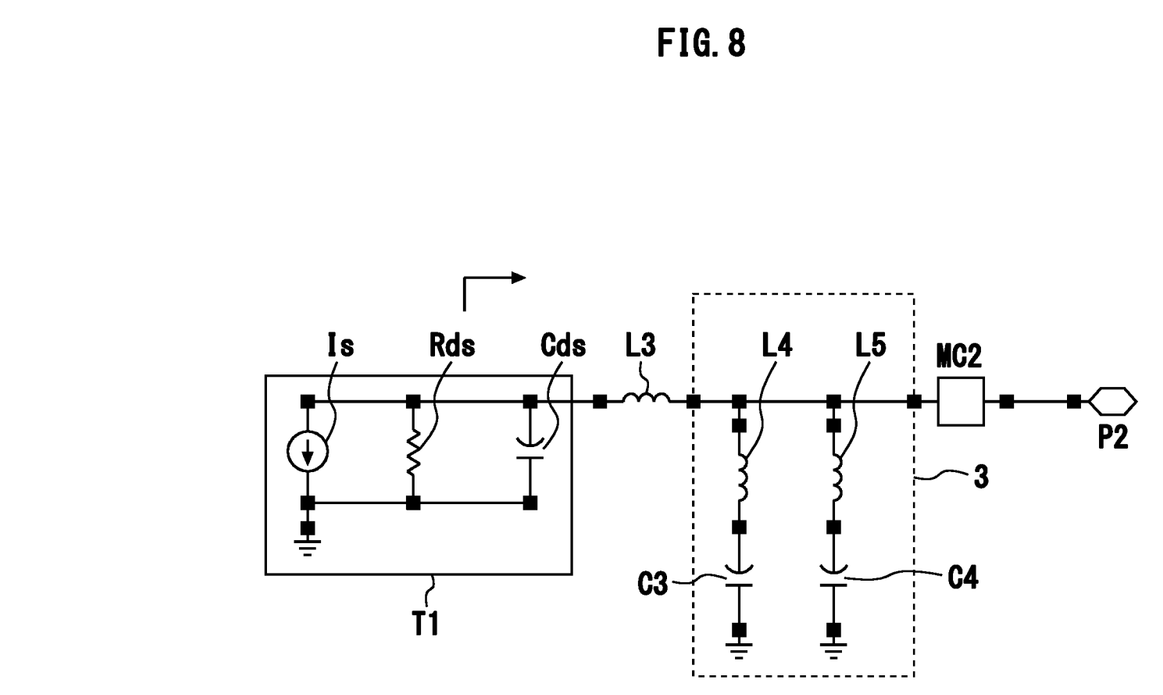
FIG. 8 is a circuit diagram illustrating a high frequency amplifier according to a comparative example.

Subsequently, effects of the present embodiment will be described while comparing with effects of a comparative example FIG. 8 is a circuit diagram illustrating a high frequency amplifier according to a comparative example. The harmonic matching circuit 3 includes a resonant circuit for a second harmonic, including the inductor L4 and the capacitor C3, and a resonant circuit for a third harmonic, including the inductor L5 and the capacitor C4. In the comparative example, the inductor L4 and the inductor L5 do not form a subtractive-polarity coupler.

Figure 9:
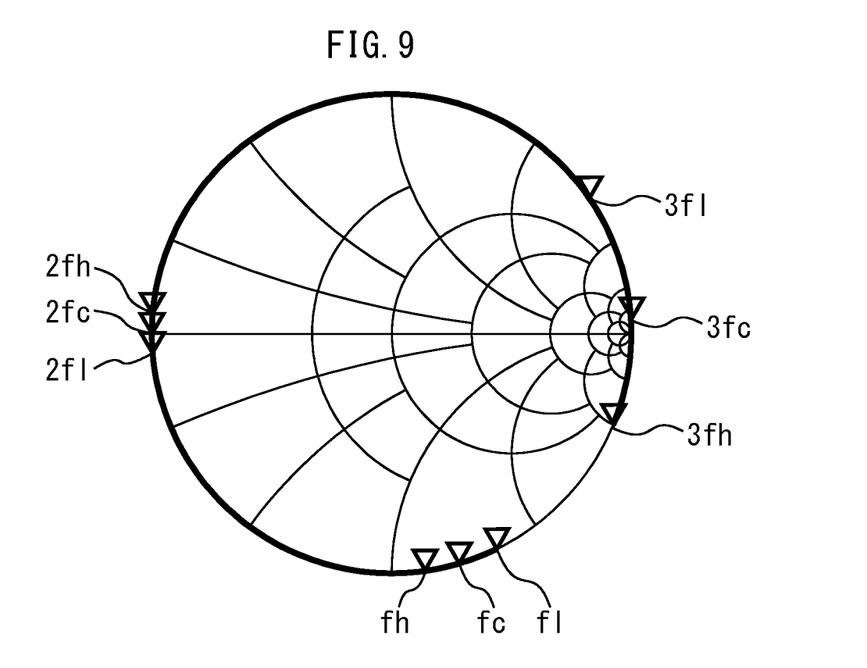
FIG. 9 is a view illustrating trajectory of output impedance seen from the output end of the transistor in Embodiment 1.
Figure 10:
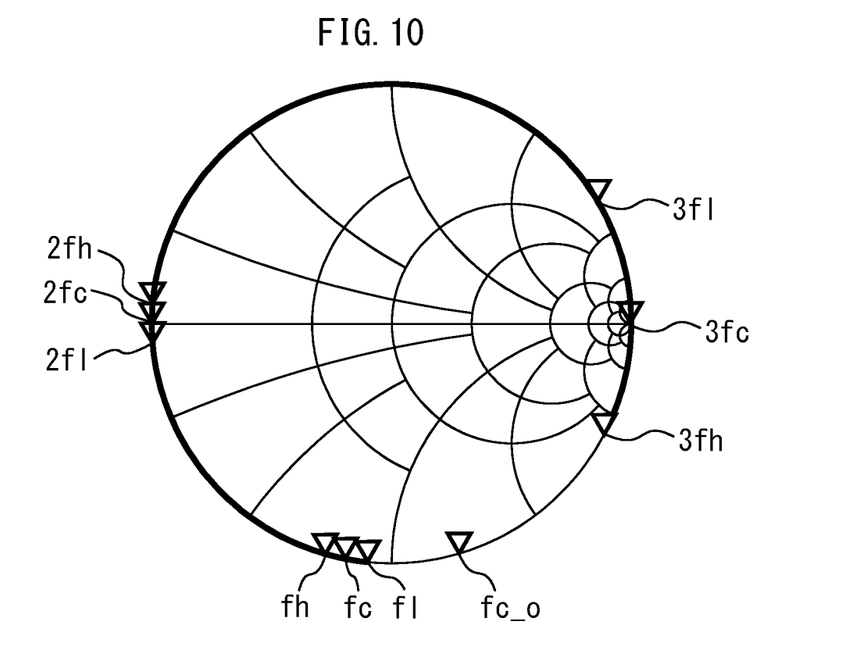
FIG. 10 is a view illustrating trajectory of output impedance seen from an output end of a transistor in the comparative example.
Figure 11:
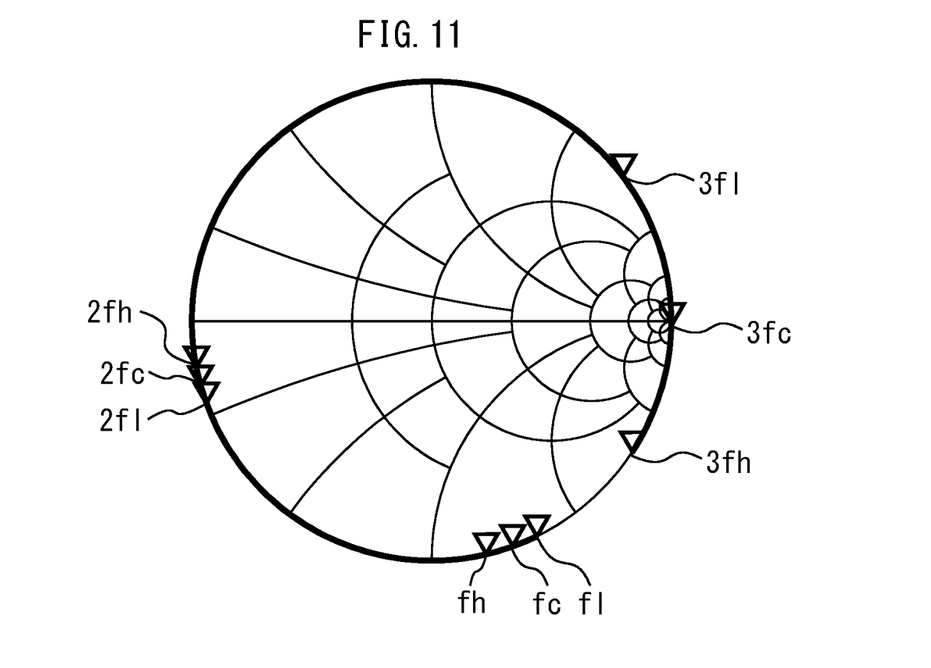
FIG. 11 is a view illustrating trajectory of output impedance seen from an output end of a transistor in the comparative example.

FIG. 9 is a view illustrating trajectory of output impedance seen from the output end of the transistor in Embodiment 1. FIG. 10 and FIG. 11 are views illustrating trajectory of output impedance seen from an output end of a transistor in the comparative example. In the drawings, reference signs fl, fc and fh respectively indicate impedance at a lower limit of a frequency band, a center of a frequency band and an upper limit of a frequency band of the fundamental harmonic. Reference signs 2fl, 2fc and 2fh respectively indicate impedance at a lower limit of a frequency band, a center of a frequency band and an upper limit of a frequency band of the second harmonic. Reference signs 3fl, 3fc and 3fh respectively indicate impedance at a lower limit of a frequency band, a center of a frequency band and an upper limit of a frequency band of the third harmonic. A Reference sign fc_o indicates impedance at the center of the frequency band of the fundamental harmonic in a case where the harmonic matching circuit 3 is not included. Output impedance of the transistor T1 is impedance for the harmonic matching circuit 3 seen from a drain end of the transistor T1, an internal current source Is or internal load Rds.

As can be seen from FIG. 9 to FIG. 11, while in Embodiment 1, matching is achieved at each of the fundamental harmonic, the second harmonic and the third harmonic, in the comparative example, matching is not achieved at the second harmonic. Further, frequency characteristics of the third harmonic in Embodiment 1 is more favorable than those in the comparative example.

As can be seen from FIG. 10, in the comparative example, the condition of short-circuit for the second harmonic and open-circuit for the third harmonic, which is a necessary condition at class F operation is satisfied by optimizing L4, C3, L5 and C4. However, impedance at the fundamental harmonic is shifted from fc_o to fc.

Wideness of a frequency range in which matching can be achieved at a reflection coefficient equal to or less than a certain reflection coefficient at an amplifier will be referred to as broadband performance. It is known that typically, broadband performance of an amplifier is inversely proportional to Rds·Cds of the transistor T1. In the comparative example, as illustrated in FIG. 10, fc is shifted from impedance fc_o in a case where a harmonic circuit is not included. If equivalent parasitic capacity of the transistor T1 is Cds', Cds becomes Cds<Cds' and broadband performance degrades. Further, if Cds' increases, it is necessary to add a circuit which compensates for increase of the capacity, which leads to a problem that loss of an output matching circuit increases, or the like.

In FIG. 11, impedance for the fundamental harmonic and the third harmonic is fixed. As can be seen from FIG. 11, if impedance for the fundamental harmonic is fixed at fc_o, and impedance 3fl, 3fc and 3fh for the third harmonic is fixed at open, a problem arises that impedance 2fl, 2fc and 2fh for the second harmonic is shifted from a short-circuited end. It is therefore difficult in the comparative example to achieve impedance matching at the fundamental harmonic, the second harmonic and the third harmonic at the same time.

In contrast, in the present embodiment, even in a case where parasitic inductance exists due to the wire W1 which connects the drain pad of the transistor T1 and the harmonic matching circuit 3 which are the main parasitic components at the high frequency amplifier, it is possible to achieve impedance matching at the fundamental harmonic, the second harmonic and the third harmonic at the same time.

Embodiment 2

Figure 12:
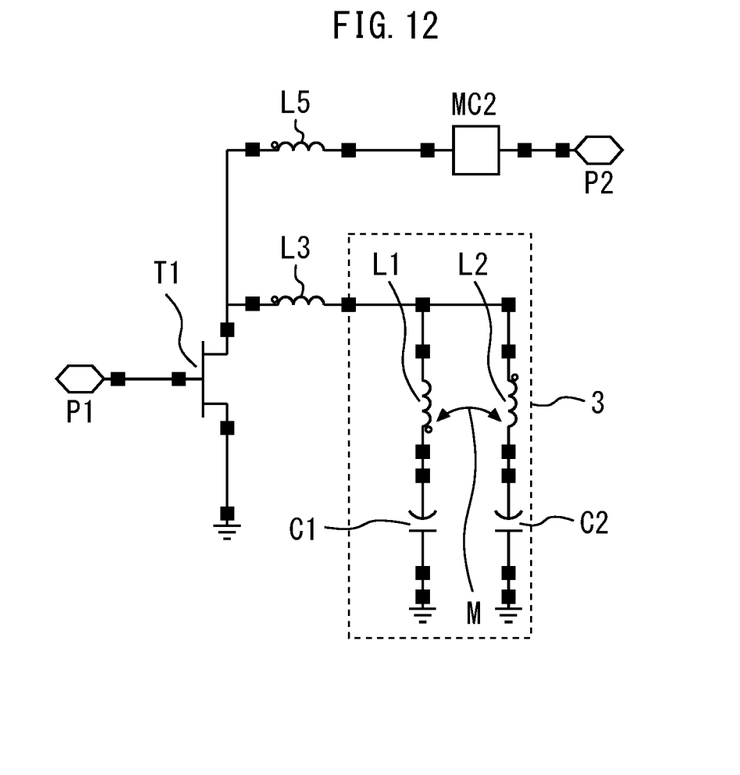
FIG. 12 is a circuit diagram illustrating a high frequency amplifier according to Embodiment 2.
Figure 13:
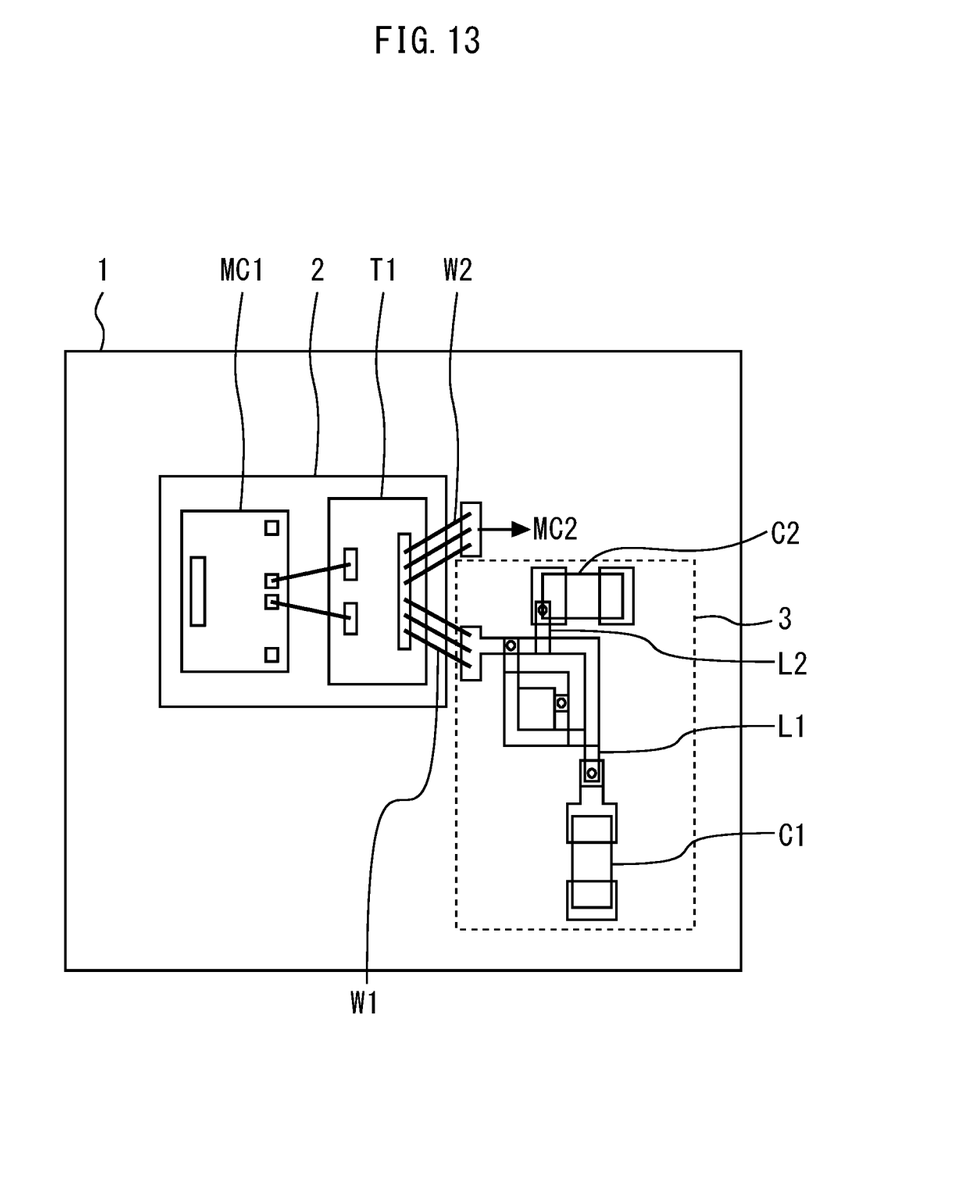
FIG. 13 is a top view illustrating the high frequency amplifier according to Embodiment 2.

FIG. 12 is a circuit diagram illustrating a high frequency amplifier according to Embodiment 2. FIG. 13 is a top view illustrating the high frequency amplifier according to Embodiment 2. The harmonic matching circuit 3 is connected to the drain of the transistor T1 via the wire W1. Meanwhile, the fundamental harmonic matching circuit MC2 is connected to the drain of the transistor T1 via a wire W2 which is separately provided. The wire W2 has a parasitic inductor L5. The fundamental harmonic matching circuit MC2 for the fundamental harmonic is separated from the harmonic matching circuit 3 at the drain of the transistor T1. The wire W2 is obliquely positioned with respect to the wire W1. This can reduce coupling between the wires, so that less interference can be achieved between the fundamental harmonic matching circuit MC2 and the harmonic matching circuit 3. It is therefore possible to separately optimize the fundamental harmonic matching circuit MC2 and the harmonic matching circuit 3, which facilitates circuit design.

Embodiment 3

Figure 14:
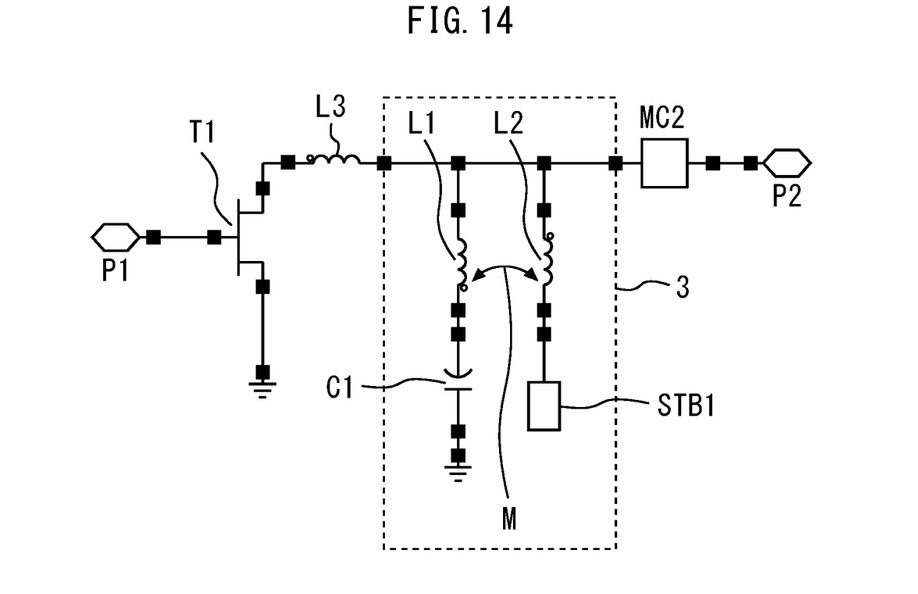
FIG. 14 is a circuit diagram illustrating a high frequency amplifier according to Embodiment 3.

FIG. 14 is a circuit diagram illustrating a high frequency amplifier according to Embodiment 3. The second capacitor C2 in Embodiment 1 supports a high frequency which is three times as high as a fundamental frequency. For example, in a case of an amplifier in a 3 GHz band, the second capacitor C2 supports 9 GHz. Thus, a capacitance value of the second capacitor C2 is equal to or less than 1 pF, which requires accuracy. In Embodiment 1, a chip capacitor is used as the second capacitor C2. However, a step of a capacitance value of a commercially available chip capacitor is 0.1 pF which is coarse. Further, a large pad is required for mounting the chip capacitor and has parasitic capacity of approximately a fraction of a pF. It is therefore difficult to finely adjust the capacitance value of the second capacitor C2.

Thus, in the present embodiment, the second capacitor C2 in Embodiment 1 is replaced with an open stub STB1. This enables fine adjustment of the capacitance value. Further, this eliminates the necessity of a pad for mounting a capacitor, so that a circuit scale can be reduced. Note that interlayer capacity formed with the glass epoxy substrate 1 and wiring may be used in place of the open stub STB1.

Embodiment 4

In the present embodiment, in the circuit configuration in Embodiment 1, constants of the first inductor L1, the first capacitor C1, the second inductor L2 and the second capacitor C2 are set so that impedance for the harmonic matching circuit 3 seen from the output end of the transistor T1 resonates with the parasitic capacity Cds within the transistor T1 and is open-circuited for the second harmonic, and is short-circuited for the third harmonic. This can satisfy harmonic conditions for the high frequency amplifier to perform inverse class F operation.

Figure 15:
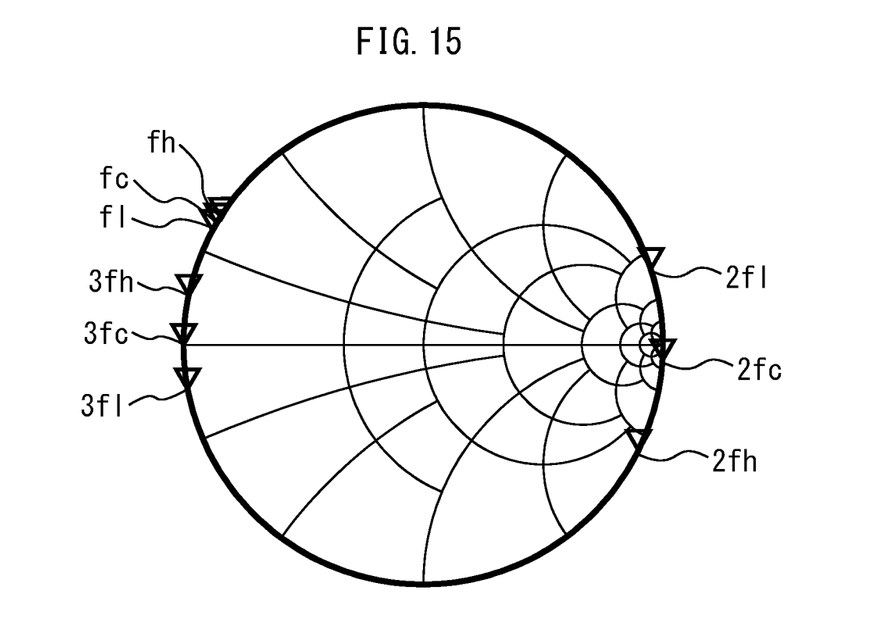
FIG. 15 is a view illustrating output impedance seen from the output end of the transistor in Embodiment 4.

FIG. 15 is a view illustrating output impedance seen from the output end of the transistor in Embodiment 4. It can be seen that while the fundamental harmonic is largely affected, a condition of open-circuit for a frequency of the second harmonic and short-circuit for the third harmonic, which is an impedance condition of the inverse class F amplifier, can be achieved by adjusting each constant. Further, a short-circuited condition is satisfied for the third harmonic over a wide band by mutual inductance having subtractive polarity.

Embodiment 5

Figure 16:
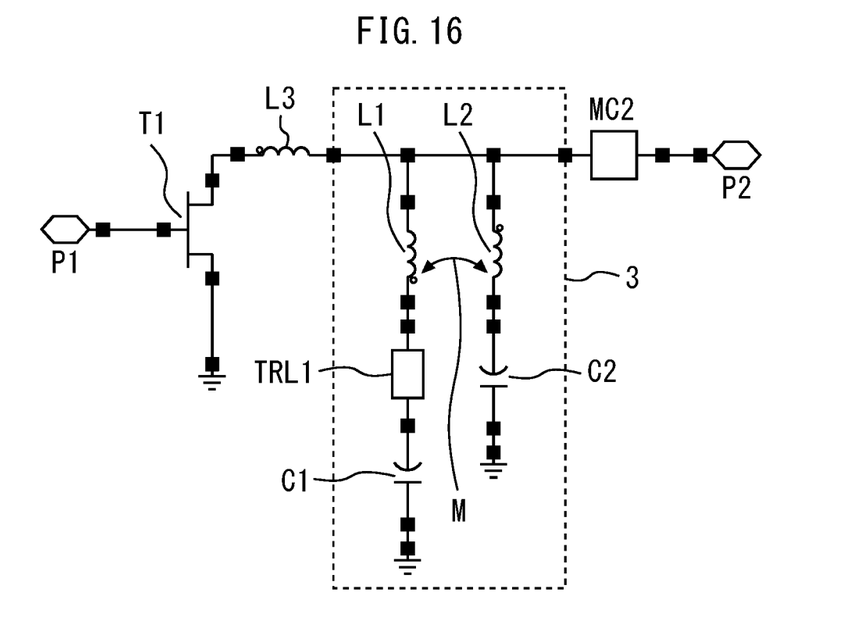
FIG. 16 is a circuit diagram illustrating a high frequency amplifier according to Embodiment 5.

FIG. 16 is a circuit diagram illustrating a high frequency amplifier according to Embodiment 5. In addition to the configuration of Embodiment 4, a transmission line TRL1 whose electrical length is λ/4 with respect to a wavelength λ of the fundamental harmonic is connected between the first inductor L1 and the first capacitor C1.

In Embodiment 4, impedance for the fundamental harmonic seen from a current source of the transistor T1 is largely affected by two LC resonant circuits. To address this, by inserting the transmission line TRL1, it is possible to reduce influence on the fundamental harmonic, which facilitates circuit design.

Figure 17:
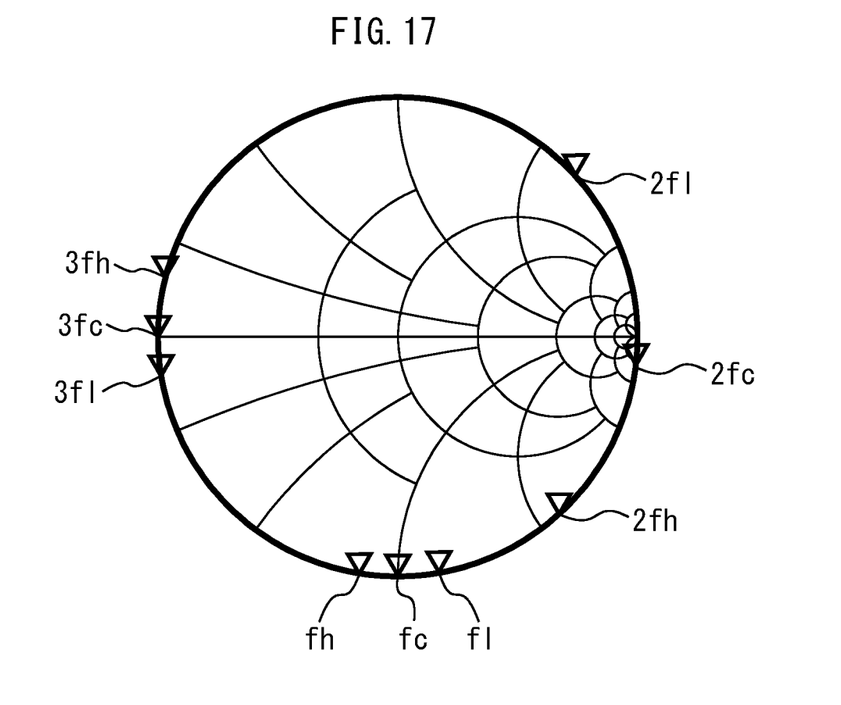
FIG. 17 is a view illustrating trajectory of output impedance seen from the output end of the transistor in Embodiment 5.

FIG. 17 is a view illustrating trajectory of output impedance seen from the output end of the transistor in Embodiment 5. It can be seen that insertion of the transmission line TRL1 reduces influence on the fundamental harmonic.

REFERENCE SIGNS LIST 1 glass epoxy substrate; 3 harmonic matching circuit; C1 first capacitor; C2 second capacitor; L1 first inductor; L2 second inductor; MC2 fundamental harmonic matching circuit; STB1 open stub; T1 transistor (amplifier); TRL1 transmission line; W1 first wire; W2 second wire

The invention claimed is:
1. A high frequency amplifier comprising:
an amplifier amplifying an input signal; and
a harmonic matching circuit connected to an output end of the amplifier via a first wire,
wherein the harmonic matching circuit includes a first inductor connected to the first wire, a first capacitor connected in series to the first inductor, a second inductor connected in parallel with the first inductor, and a second capacitor connected in series to the second inductor, and
the first inductor and the second inductor form a subtractive-polarity coupler which presents mutual inductance having subtractive polarity,
wherein
impedance for the harmonic matching circuit viewed from the output end of the amplifier is open-circuited for a fundamental harmonic, short-circuited for a second harmonic and open-circuited for a third harmonic of the input terminal, and the high frequency amplifier performs class F operation.

2. The high frequency amplifier according to claim 1, wherein the first inductor and the second inductor are wound in directions opposite to each other and overlap with each other.

3. The high frequency amplifier according to claim 1, wherein impedance of a resonant circuit constituted with the second inductor and the second capacitor exhibits capacitance for a frequency equal to or lower than the second harmonic and exhibits inductivity for the third harmonic, and
impedance of a resonant circuit constituted with the first inductor and the first capacitor exhibits inductivity for the fundamental harmonic.

4. A high frequency amplifier comprising:
an amplifier amplifying an input signal; and
a harmonic matching circuit connected to an output end of the amplifier via a first wire,
wherein the harmonic matching circuit includes a first inductor connected to the first wire, a first capacitor connected in series to the first inductor, a second inductor connected in parallel with the first inductor, and a second capacitor connected in series to the second inductor, and
the first inductor and the second inductor form a subtractive-polarity coupler which presents mutual inductance having subtractive polarity,
wherein impedance for the harmonic matching circuit viewed from the output end of the amplifier is open-circuit for a second harmonic and short-circuit for a third harmonic of the input terminal, and the high frequency amplifier performs inverse class F operation.

5. The high frequency amplifier according to claim 4, further comprising a transmission line connected between the first inductor and the first capacitor and whose electrical length is λ/4 with respect to a wavelength λ of the input terminal.

6. The high frequency amplifier according to claim 1, further comprising a fundamental harmonic matching circuit connected to a connection point of the first wire and the harmonic matching circuit.

7. The high frequency amplifier according to claim 1, further comprising a fundamental harmonic matching circuit connected to the output terminal of the amplifier with a second wire.

8. The high frequency amplifier according to claim 7, wherein the second wire is obliquely positioned with respect to the first wire.

9. The high frequency amplifier according to claim 1, wherein the first capacitor and the second capacitor are chip capacitors.

10. The high frequency amplifier according to claim 1, wherein the second capacitor is interlayer capacity formed with a multi-layer glass epoxy substrate and wiring.

11. The high frequency amplifier according to claim 1, wherein the second capacitor is an open stub.

12. The high frequency amplifier according to claim 1 wherein the amplifier is a GaN-based HEMT chip, and
   the first inductor and the second inductor are formed with wiring layers of a glass epoxy substrate.

\* \* \* \* \*